(12) United States Patent
Morisada et al.

(10) Patent No.: US 7,080,393 B2
(45) Date of Patent: Jul. 18, 2006

(54) RECEIVER HAVING A PRESET TUNER

(75) Inventors: Katsuhiro Morisada, Osaka (JP); Shigeto Sakakibara, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 1037 days.

(21) Appl. No.: 09/842,258

(22) Filed: Apr. 25, 2001

(65) Prior Publication Data
US 2002/0013946 A1    Jan. 31, 2002

(30) Foreign Application Priority Data
Apr. 26, 2000    (JP)    ............... 2000-002746

(51) Int. Cl.
G06F 3/00    (2006.01)
G06F 13/00    (2006.01)
H04N 5/445    (2006.01)

(52) U.S. Cl. ............... 725/38; 348/731; 348/732

(58) Field of Classification Search ............... 725/38, 725/37; 348/732
See application file for complete search history.

(56) References Cited

U.S. PATENT DOCUMENTS

| | | | | |
|---|---|---|---|---|
| 4,594,611 A | * | 6/1986 | Sugibayashi et al. | ........ 348/731 |
| 4,776,038 A | * | 10/1988 | Testin et al. | ............. 455/182.3 |
| 5,087,977 A | * | 2/1992 | Suizu | ........................ 348/732 |
| 5,299,011 A | * | 3/1994 | Choi | ............................ 348/732 |
| 5,479,214 A | * | 12/1995 | Sakakibara et al. | ......... 348/558 |
| 5,594,510 A | * | 1/1997 | Sakakibara | ................. 348/731 |
| 5,812,928 A | * | 9/1998 | Watson et al. | .............. 725/118 |
| 6,038,433 A | * | 3/2000 | Vegt | ........................ 455/161.1 |
| 6,064,449 A | * | 5/2000 | White et al. | ................. 348/732 |
| 6,400,422 B1 | * | 6/2002 | Nakamura | ................... 348/732 |
| 6,680,756 B1 | * | 1/2004 | Morisada | .................... 348/732 |
| 6,721,018 B1 | * | 4/2004 | Shintani et al. | ............. 348/731 |
| 6,734,804 B1 | * | 5/2004 | Lee | ........................ 340/825.72 |
| 6,798,463 B1 | * | 9/2004 | Sakakibara | ................. 348/732 |
| 6,938,271 B1 | * | 8/2005 | Sakakibara | ................. 725/151 |

FOREIGN PATENT DOCUMENTS

| | | |
|---|---|---|
| JP | 6-5227 | 1/1994 |
| JP | 07-087415 | 3/1995 |
| JP | 3068702 | 2/2000 |
| JP | U3068428 | 2/2000 |
| JP | 2000-184301 | 6/2000 |
| JP | 2000-002746 | 12/2004 |

* cited by examiner

Primary Examiner—Vivek Srivastava
Assistant Examiner—Farzana E. Hossain
(74) Attorney, Agent, or Firm—Myron Greenspan, Esq.; Lackenbach Siegel, LLP

(57) ABSTRACT

A receiver includes a CPU. The CPU, when executing preset registration, in step S1 first searches for the presence or absence of receivable channels. If there are receivable channels, received data (center frequency, etc.) is registered in step S2. If the received channel is a TV channel, filtering is carried out in step S4 to count only the channels existing within a range of ± approximately 200 kHz of a center frequency. If it is a CATV channel, counting is further made in step S5 on the channels existing within the range of ± approximately 200 kHz of the center frequency, and a filter process is carried out in order to remove the channels within the range of ± approximately 200 kHz of the center frequency +2 MHz of a CATV UHF-band channel overlapped with a TV channel.

8 Claims, 4 Drawing Sheets

FIG. 3

EXAMPLE OF FREQUENCY TABLE

| NAME | CH | STANDARD | HRC | DIFF. | IRC | DIFF. | CANADIAN OFFSET | DIFF. |
|---|---|---|---|---|---|---|---|---|
| 2 | 2 | 55.25 | 54 | −1.25 | 55.25 | 0 | 55.25 | 0 |
| 3 | 3 | 61.25 | 60 | −1.25 | 61.25 | 0 | 61.25 | 0 |
| 4 | 4 | 67.25 | 66 | −1.25 | 67.25 | 0 | 67.25 | 0 |
| 5A | 1 | 73.25 | 72 | −1.25 | 73.25 | 0 | − | − |
| 5 | 5 | 77.25 | 78 | +0.75 | 79.25 | +2.0 | 77.25 | 0 |
| 6 | 6 | 83.25 | 84 | +0.75 | 85.25 | +2.0 | 83.25 | 0 |
| A-5 | 95 | 91.25 | 90 | −1.25 | 91.25 | 0 | − | − |
| A-4 | 96 | 97.25 | 96 | −1.25 | 97.25 | 0 | − | − |
| A-3 | 97 | 103.25 | 102 | −1.25 | 103.25 | 0 | − | − |
| A-2 | 98 | 109.25 | 108 | −1.25 | 109.25 | 0 | 109.25 | 0 |
| A-1 | 99 | 115.25 | 114 | −1.25 | 115.25 | 0 | 115.25 | 0 |
| A ↓ 1 | 14 ↓ 22 | 121.25 ↓ 169.25 | 120 ↓ 168 | −1.25 | 121.25 ↓ 169.25 | 0 | 121.25 ↓ 169.25 | 0 |
| 7 ↓ 13 | 7 ↓ 13 | 175.25 ↓ 211.25 | 174 ↓ 210 | −1.25 | 175.25 ↓ 211.25 | 0 | 175.25 ↓ 211.25 | 0 |
| J ↓ W | 23 ↓ 36 | 217.25 ↓ 295.25 | 216 ↓ 294 | −1.25 | 217.25 ↓ 295.25 | 0 | 216.25 ↓ 294.25 | −1 ↓ −1 |
| AA ↓ QQ | 37 ↓ 53 | 301.25 ↓ 397.25 | 300 ↓ 396 | −1.25 | 301.25 ↓ 397.25 | 0 | 300.25 ↓ 396.25 | −1 ↓ −1 |
| RR | 54 | 40.325 | 402 | −1.25 | 403.25 | 0 | − | − |
| SS | 55 | 409.25 | 408 | −1.25 | 409.25 | 0 | − | − |
| TT | 56 | 415.25 | 414 | −1.25 | 415.25 | 0 | − | − |
| UU | 57 | 421.25 | 520 | −1.25 | 421.25 | 0 | − | − |
| VV | 58 | 427.25 | 426 | −1.25 | 427.25 | 0 | − | − |
| WW | 59 | 433.25 | 432 | −1.25 | 433.25 | 0 | − | − |
| AAA | 60 | 439.25 | 438 | −1.25 | 439.25 | 0 | − | − |
| BBB | 61 | 445.25 | 444 | −1.25 | 445.25 | 0 | − | − |
| CCC | 62 | 451.25 | 450 | −1.25 | 451.25 | 0 | − | − |
| DDD | 63 | 457.25 | 456 | −1.25 | 457.25 | 0 | − | − |
| EEE | 64 | 463.25 | 462 | −1.25 | 463.25 | 0 | − | − |

(PRIOR ART)

RECEIVER HAVING A PRESET TUNER

BACKGROUND OF THE INVENTION

1. Field of the Invention

This invention relates to a receiver having a preset tuner and, more particularly, to a receiver that counts the number of receivable channels in order to determine whether a signal is within a terrestrial-wave television broadcast channel plan or within a CATV broadcast channel plan.

2. Description of the Prior Art

Receivers of this kind are disclosed, for example, in Japanese Laid-open No. 87415/1995 (H04N5/44, 7/16) laid open on Mar. 31, 1995; U.S. Pat. No. 4,776,038; Japanese Patent Laid-open No. 184301/2000 (H04N5/44, 5/02, 7/18) laid open on Jun. 30, 2000, among others (and so on). This prior art can determine whether broadcast channels are within a CATV channel plan by detecting the presence of (a plurality of) particular CATV channels, in an automatic determination as to whether they are within a terrestrial-wave television broadcast (hereinafter, "TV" or "TV broadcast") or within a CATV broadcast.

The prior art, however, can do nothing more than count the number of receivable channels from a range of particular CATV channels in which spurious signals or "ghosts" are not taken into consideration. That is to say, where many channels are present, it may happen that the sum or difference frequency between two particular frequencies falls under and is received by the broadcast station (ghost) having a certain frequency range or the incorrect reception results due to spurious reception. In the prior art, there has always existed the possibility of miscounting, which can in an incorrect determination.

Furthermore, the present applicant has proposed, in Japanese Utility Model Registration No. issued on May 12, 2000, a novel method for resolving this problem. The method proposed is to determine whether the channel frequency of each reception is within a certain frequency range within the center frequency. If it is within a predetermined frequency range, it is counted as a receivable channel.

This method reduces the miscounting due to "ghosts" or spurious signals, but cannot completely preclude such miscounting.

SUMMARY OF THE INVENTION

Therefore, it is a primary object of the present invention to provide a receiver having a preset tuner capable of determining a correct channel plan.

A receiver according to the present invention conducts a search within a first frequency range with respect to a center frequency of each channel to register received data into a memory. It also counts the number of receivable channels thereby determining whether the broadcast channels are within a terrestrial-wave television broadcast channel plan or within a CATV broadcast channel plan, comprising: frequency-setting means for setting a second frequency range to be narrower than the first frequency range; and determining means for determining whether broadcast channels are within a terrestrial wave television broadcast or within a CATV broadcast by counting the number of received channels in the second frequency range.

Incidentally, the first frequency range is ± approx. 2 MHz of the center frequency while the second frequency range is ± approx. 200 kHz of the center frequency.

Also, when counting the number of receivable channels of CATV broadcast in a UHF band that overlaps with television channels, a third frequency range of approx. 200 kHz about a center frequency may be set that is +2 MHz. In this case, because the frequency range of the center frequency +2 mHz ± approx. 200 kHz is excluded, it is possible to completely avoid miscounting within that frequency range.

When carrying out preset registration, search is first made for the presence or absence of receivable channels in the first frequency range. If there is a receivable channel, reception data (center frequency, etc.) is registered. If the reception channel is a TV channel, filtering is made to count only the channels existing in a range of the center frequency ± approx. 200 kHz. If it is a CATV channel, counting is only for the channels existing in the range of the center frequency ± approx. 200 kHz and, in the channel in a UHF band, a filtering process is carried out that removes of the channels in the range of the center frequency +2 MHz ± approx. 200 kHz.

According to this invention, because the channels received due to spuriousness, ghost or images are excluded in counting receivable channels, receivable channels can be correctly counted. Thus, a TV channel plan or a CATV channel plan can be accurately determined and set.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a table exemplifying an actual channel plan including a North American standard, HRC, IRC and Canadian Offset;

DETAILED DESCRIPTION OF THE PREFERRED EMBODIMENT

Figure 1:
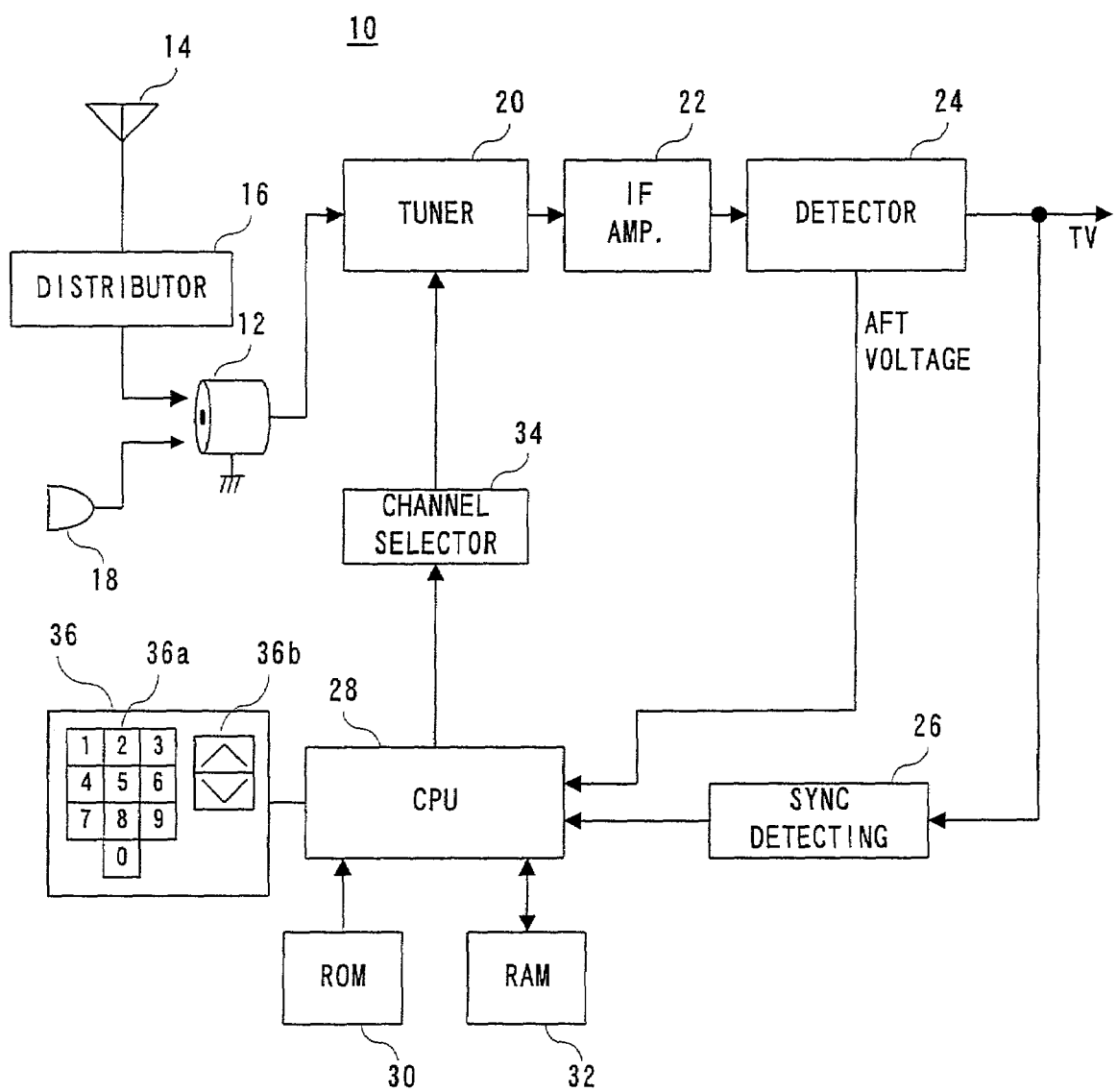
FIG. 1 is a block diagram showing a television receiver according to an embodiment of the present invention.

An embodiment of a receiver 10 shown in FIG. 1 includes an input terminal 12. To this input terminal 12 is connected a television antenna 14 through a distributor 16 or directly with a CATV cable terminal 18. Consequently, the input terminal 12 receives a television broadcast signal or a CATV broadcast signal. The broadcast signal is supplied through the input terminal 12 to a tuner 20. The tuner 20 converts the received broadcast signal into an intermediate frequency signal and outputs it to an IF amplifier 22. The intermediate frequency signal from the If amplifier 22 is sent to the waveform detector 24. Hence, a television signal is outputted from the waveform detector 24.

The television signal is delivered to a synchronization detecting circuit 26. The synchronization detecting circuit 26, when detecting a synchronizing signal contained in the television signal, supplies a detection signal to a CPU 28. The CPU 28 cooperates with a ROM 30 and a RAM 32 to configure a microcomputer or microprocessor, to receive an AFT (Automatic Fine Tuning) voltage from the foregoing waveform-detector 24. According, the CPU 28 can determine from the AFT voltage whether the tuner is tuned to a desired channel of television broadcast or CATV broadcast.

Incidentally, the ROM 30 constituting a microcomputer is previously written with a table of frequency allotment. Meanwhile the RAM 32 stores a result of the channel selection. The CPU 28 controls a channel selector 34 on the basis of a signal from the synchronization detection circuit 26 and AFT voltage as well as information about ROM 30. The channel selector 34 converts the control data from the CPU 28 into a tuning signal and applies it to a tuner 20 (the local oscillation circuit thereof is not shown). In recent years the channel selectors of this kind have frequently used PLL circuits, and therefore any more detailed explanation is omitted.

The CPU 28 is also coupled with a keyboard 36. This keyboard 36 includes ten keys 36a to allow a user to manually input a channel number, and an up-down key 36b for the user to use in controlling channels and/or volume. When the user operates the ten keys 36a to input a channel number, the CPU 28 provides the channel selector with frequency band data and frequency data for the channel number. Consequently, the channel selector 34 applies to the tuner 20 a band-select signal according to the frequency band data and a frequency control signal, or tuning voltage, depending on the frequency data. This allows the user to view a channel as desired. At this time, the CPU 28 searches for a center frequency for the user-input channel number and a frequency range within a first frequency range (usually, approx. ±2 MHz) including the center frequency.

Figure 2:
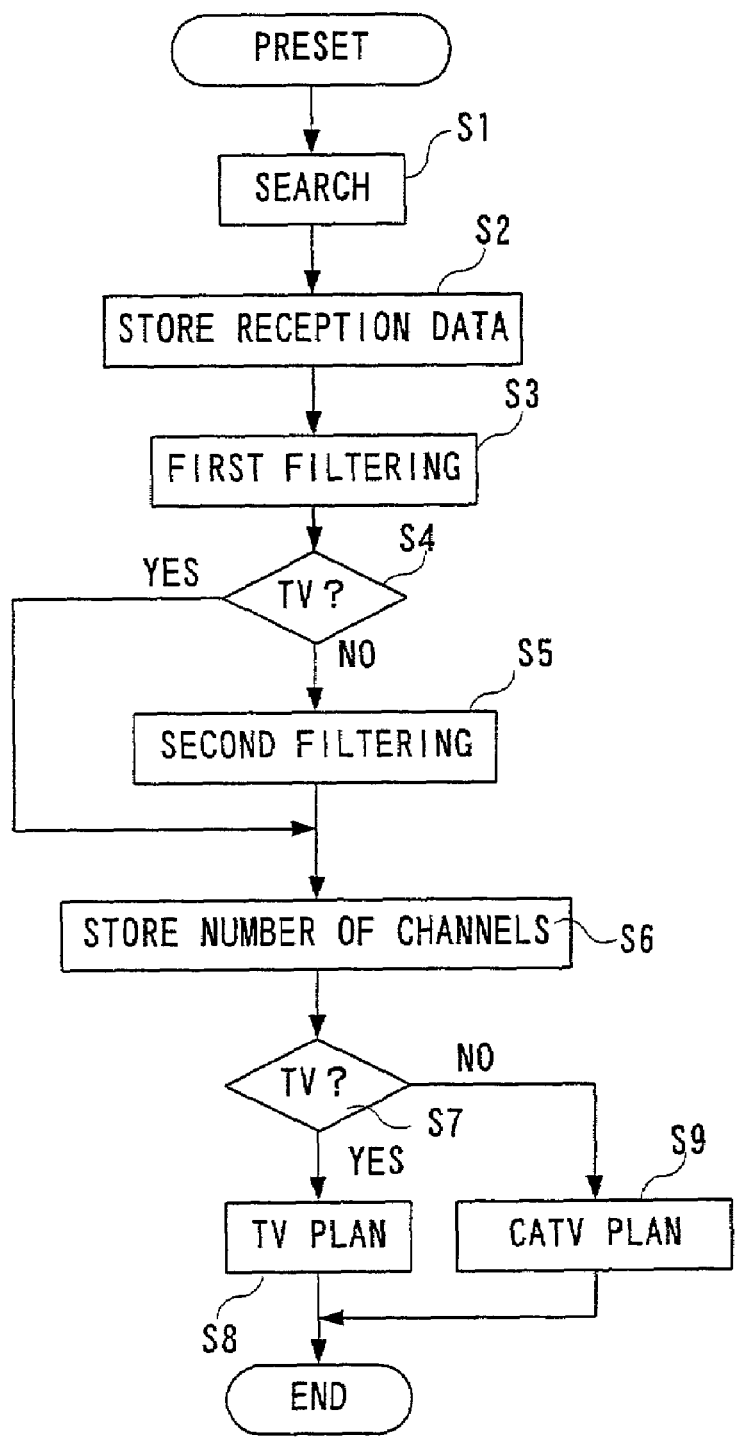
FIG. 2 is a flowchart showing preset operation in the FIG. 1 embodiment.

Referring to FIG. 2, explanation will be made on the preset operation in the FIG. 1 embodiment. At a first step SI, the CPU 28 supplies a control signal to the tuner 20 by way of the channel selector 34, to carry out search operation. In the process of search, if the CPU 28 receives a proper AFT voltage value from the waveform detector 24 or a signal representative of the presence of a synchronization signal from the synchronization detecting circuit 26, this means a reception of a television broadcast. The CPU 28 registers the reception data (reception frequency, channel, etc.) into the RAM 32. As for the reception data, various forms may be considered including data representative of reception frequency, difference from the center frequency, etc. As for the channel, various ways are to be considered including channel No. per se, substitutive use of a memory address for storing data, etc.

Thereafter, in step S3, a first filter process is carried out.

In the North America, as shown in FIG. 3, the frequencies are assigned for each channel as concerned with HRC, IRC and Canadian Offset, besides the US Standard. In the Canadian Offset, there is a channel having a frequency set 1 MHz lower than that of the US Standard. Also, in HRC as a cable channel, the frequencies of channel 5 and channel 6 are set 0.75 MHz higher than the US Standard and the other channels have frequencies set 1.25 MHz lower than that. In the IRC as a cable channel, the frequencies of channel 5 and channel 6 are set 2 MHz higher and the frequency of the other channels are set same as those of the US Standard.

From studying the image frequencies about the center frequency on all the channels under the U.S. Standard, HRC, IRC or Canadian Offset, it has been revealed that there exist no image frequencies in the range of nearly ±200 kHz of a channel center frequency. On the contrary, there is a possibility that image frequencies exist in a region beyond a range of ±250 kHz of the center frequency.

Figure 4:
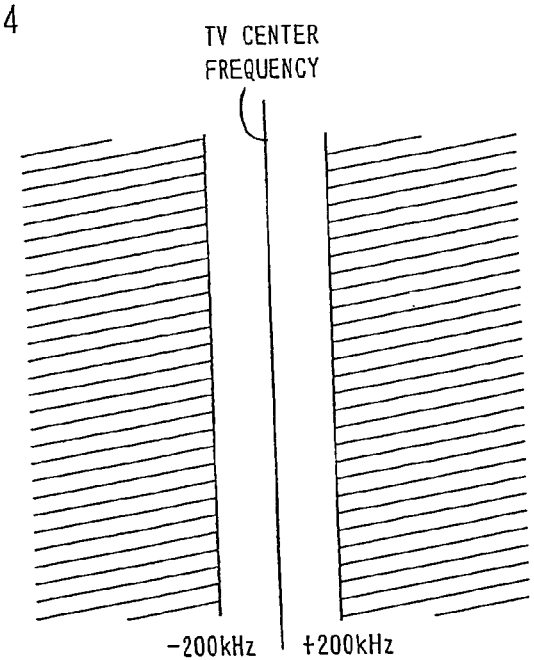
FIG. 4 is an illustrative view showing a first filter process for TV.

Accordingly, in the embodiment a filtering process is performed to count receivable channels existing only within a frequency range of approximately ±200 kHz of the center frequency, as shown in FIG. 4. This permits the avoidance of incorrect determinations that would occur due to counting image frequencies as channel reception.

The counting, in this case, means counting for determination of TV or CATV. The data of channels out of the count condition is not erased, i.e., the data is left in the memory. However, after the completion of determination, any of the data on a TV channel plan or CATV channel plan will be saved in the memory.

Considering the UHF band U, not shown in FIG. 3, TV channel 14 is at 471.25 MHz while CATV channel 65 is at 469.25 MHz. That is to say, the TV channel 14 exists 2 MHz above the frequency of CATV channel 65. Particularly in an urban region, where channels are broadcast within a service area of a greater-powered stations by a lesser-powered local station utilizing the UHF radiowave directivity, a continuity of TV-channels will occur that is not found in nature. That is to say, two receivable channels will exit continuously within a region in which the greater-powered station has a radiowave almost as weak as the radiowave of a local station. On the other hand, on establishing a CATV channel plan, it is possible to use a technique of establishing and finally confirming "channel continuity." In this case, one must exclude the possibility of counting a TV channel when counting CATV receivable channels.

Figure 5:
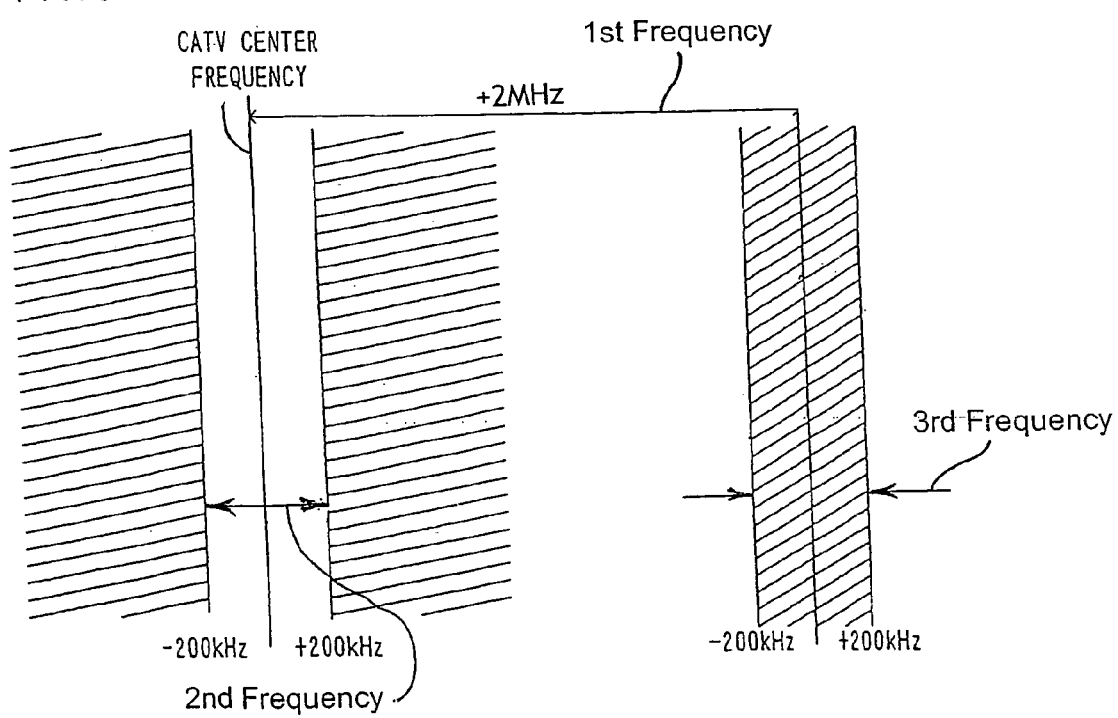
FIG. 5 is an illustrative view showing a second filter process for CATV.

In this embodiment, it is determined in step S4 whether TV channels or CATV channels are detected. If they are CATV channels, in step S5 a second filtering process as shown in FIG. 5 is performed. That is, "counting" is only for the receivable channels existing within the range of approximately ±200 kHz around the CATV-channel center frequency. Further more, in the UHF band a frequency range of a center frequency +2 MHz ± approx. 200 kHz is excluded. It should be easily understood that the center frequency +2 MHz is on the ground of the frequency difference between the adjacent channels of TV and CATV in the UHF band and is greater than 2 MHz. Even if continuity occurs between the UHF broadcast stations in a big city, as mentioned above, the filter process of step S5 delimits it to TV. This eliminates the possibility of making an incorrect determination that the station is CATV.

After the filtering process of the steps S4 and S5 in this manner, in step S6 the respective number of receivable channels as TV and CATV are counted by the counters formed in a proper area of the RAM 32.

It is then determined in step S7, according to a count value of the counter, whether within a TV channel plan or CATV channel plan. If "YES" is determined in the step S7, in step S8 preset registration is carried out according to the TV channel plan. If "NO" in step S9, preset registration is carried out according to the CATV plan.

In this manner, when determining to adopt a TV plan or a CATV plan depending upon the number of receivable channels, preset registration can be correctly done according to a correct channel plan if miscounting due to spuriousness, ghost or images is avoided. The preset registration, in this case, refers to transfer of data into a predetermined address space of a memory according to a determination result.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A receiver for conducting searches with first frequency ranges with respect to first center frequencies of each channel to register received data into a memory and counting the number of receivable channels, thereby determining whether the channels are within a terrestrial-wave television broadcast channel plan or within a CATV broadcast channel plan, comprising:

frequency setting means for setting third frequency ranges of approximately ±200 kHz about second center frequencies frequency-shifted +2 MHz from an associated first center frequency when counting the number of receivable channels of CATV broadcast in a UHF band overlapping with a television channel outside of said third frequency ranges.

2. A receiver according to claim 1, wherein the first frequency ranges are frequency ranges of approximately ±2 MHz around associated first center frequencies.

3. A receiver for conducting searches within first frequency ranges with respect to center frequencies of each channel to register received data into a memory and counting the number of receivable channels, thereby determining whether the channels are within a terrestrial-wave television broadcast channel plan or within a CATV broadcast channel plan, comprising;

first frequency setting means for setting filtering second frequency ranges more narrowly than and within the first frequency ranges;

second frequency setting means for setting filtering third frequency ranges of approximately ±200 kHz about second center frequencies frequently shifted +2 MHz from an associated first center frequency when counting the number of receivable channels of a CATV broadcast in a UHF band overlapping with a television channel outside of said third frequency ranges; and determining means for determining whether the channels are within a terrestrial-wave television broadcast or within a CATV broadcast by counting the number of received channels filtered by said first frequency setting means and said second frequency setting means.

4. A receiver according to claim 3, wherein each second frequency range is a frequency range of approximately ±200 kHz around an associated center frequency.

5. A method for determining whether channels are within a terrestrial-wave television broadcast channel plan or within a CATV broadcast channel plan by searching in first frequency ranges with respect to first center frequencies of each channel and counting the number of receivable channels, comprising the steps of:

(a) setting filtered second frequency ranges more narrowly than and within the first frequency ranges;

(b) setting filtered third frequency ranges of approximately ±200 kHz about second center frequencies frequency-shifted +2 MHz from an associated first center frequency when counting the number of receivable channels of a CATV broadcast in a UHF band overlapped with a television channel outside of said third frequency ranges; and (c) counting the number of reception channels filtered in the second frequency ranges and outside the third frequency ranges and determining whether they are within a terrestrial-wave television broadcast or within a CATV broadcast.

6. A receiver for determining whether channels are within a terrestrial-wave television broadcast channel plan or within a CATV broadcast plan by searching first frequency ranges with respect to first center frequencies of each channel and counting the number of receivable channels, said receiver comprising a computer, wherein said computer is programmed to execute the steps of:

(a) setting filtered second frequency ranges more narrowly than and within the first frequency ranges;

(b) setting filtered third frequency ranges of approximately ±200 kHz about second center frequencies frequency shifted +2 MHz from an associated first center frequency when counting the number of receivable channels of a CATV broadcast in a UHF band overlapped with a television channel outside of said third frequency ranges; and (c) counting the number of reception channels filtered in the second frequency ranges and outside the third frequency ranges and determining whether they are within a terrestrial-wave television broadcast or within a CATV broadcast.

7. A receiver according to claim 3, wherein the first frequency ranges are frequency ranges of approximately ±2 MHz around associated center frequencies.

8. A receiver according to claim 4, wherein the first frequency ranges are frequency ranges of approximately ±2 MHz around associated center frequencies.

* * * * *